United States Patent [19]
Min et al.

[11] Patent Number: 5,888,294
[45] Date of Patent: Mar. 30, 1999

[54] EPITAXIAL GROWTH RATE VARYING METHOD FOR SIDE SURFACE OF SEMICONDUCTOR PATTERN

[75] Inventors: Suk-Ki Min; Moo Sung Kim, both of Seoul; Yong Kim, Kyungki-Do, all of Rep. of Korea

[73] Assignee: Korea Institute of Science and Technology, Seoul, Rep. of Korea

[21] Appl. No.: 609,323

[22] Filed: Mar. 1, 1996

[30]    Foreign Application Priority Data

Mar. 9, 1995 [KR] Rep. of Korea ............... 1995/4793

[51] Int. Cl.$^6$ .................................................. C30B 25/14
[52] U.S. Cl. .......................... 117/84; 117/88; 117/103; 117/104; 117/108; 117/953; 117/954
[58] Field of Search .............................. 117/84, 103, 104, 117/108, 88, 953, 954

[56]    References Cited

U.S. PATENT DOCUMENTS

| | | | |
|---|---|---|---|
| 4,404,732 | 9/1983 | Andrade | 29/571 |
| 4,910,164 | 3/1990 | Schichijo | 437/90 |
| 5,244,829 | 9/1993 | Kim | 117/954 |
| 5,400,740 | 3/1995 | Goto et al. | 117/88 |
| 5,554,561 | 9/1996 | Plumton | 437/89 |
| 5,656,538 | 8/1997 | Gardner et al. | 117/88 |

OTHER PUBLICATIONS

Hobson et al. Selective regrowth of III–V epitaxial layers by low pressure organometal vapor phase epitaxy using CCL' Journel of Vacuum Science and Technology A 11(4) pp. 1006–1010, Jul. 1993.

Kim et al., "Facet evolution of CCI doped AlGa As/GaAs multilayers during metalorganic chemical vapor deposition on patterned GaAs substrates". Journel of Crystal Growth, vol. 156 pp. 169–176, Sep. 1995.

S.D. Hersee et al., "A Study of the Orientation Dependence of Ga(Al)As Growth by MOVPE", Journal of Crystal Growth 77 (1986), pp. 310–320.

K.M. Dzurko et al., "Atmospheric Pressure MOCVD Growth of GaAs and AlGaAs on Structured Substrates", Inst. Phys. Conf. Ser. No. 96, Chapter 3, pp. 147–151.

R. Bhat et al., "Patterned Quantum Well Heterostructures Grown by OMCVD on Non–Planar Substrates Applications to Extremely Narrow SQW Lasers", Journal of Crystal Growth 93 (1988), pp. 850–856.

*Primary Examiner*—Robert Kunemund
*Attorney, Agent, or Firm*—McDermott, Will & Emery

[57]    ABSTRACT

An improved epitaxial growth rate varying method for a side surface of a semiconductor pattern capable of controlling a growth rate of a side surface of a semiconductor pattern by controlling the amount of $CCl_4$ gas supplied when forming an epitaxial layer on a patterned GaAs substrate in a metalorganic chemical deposition method, thus fabricating a desired quantum wire, and which is characterized by controlling a side-surface growth rate of an epitaxial layer in accordance with the $CCl_4$ doping gas flow rate while an epitaxial layer is formed on a patterned GaAs substrate in a metalorganic chemical deposition method and in achieving a desired substantial flatness.

16 Claims, 9 Drawing Sheets

EPITAXIAL GROWTH RATE VARYING METHOD FOR SIDE SURFACE OF SEMICONDUCTOR PATTERN

BACKGROUND OF THE INVENTION

1. Field of the Invention

The present invention relates to an epitaxial growth rate varying method for a side surface of a patterned semiconductor, and particularly to an improved epitaxial growth rate varying method for a side surface of a semiconductor capable of controlling a growth rate of a side surface of a patterned semiconductor by controlling $CCl_4$ gas when forming an epitaxial layer on a patterned GaAs substrate in a metalorganic chemical deposition method (hereinafter called an "MOCVD"), thus fabricating a desired quantum wire.

2. Description of the Conventional Art

In the industry, a study of an optical device has recently been conducted using compound semiconductor technology. However, very problematic fabrication processes, for example, such as a selective epitaxial technique, have been adopted for fabricating the optical device. However, using the selective epitaxial technique, it is possible to implement a three-dimensional structure of an epitaxial layer with only one growth step without utilization of a complicated device fabrication process. In addition, since a very complicated structure of a device is formed while an epitaxial layer is formed, any damage of a boundary surface during a device fabrication process can be prevented.

Of the above-mentioned epitaxial growth methods, a non-planar growth method is directed to forming a mesa or a V-shaped pattern on a substrate and to growing a desired epitaxial layer. The above-mentioned method has advantages in fabricating a desired device having side surfaces. In addition, it is possible to fabricate a low threshold current laser diode or an optical wave guide with a lower dopant loss.

Recently, a study on fabrication of a quantum wire in the above-mentioned non-planar growth method has been conducted. That is, it was reported that a low threshold current laser diode was fabricated by forming a new moon-shaped quantum wire on a V-shaped groove.

However, when forming a desired structure in the above-mentioned non-planar growth method, the epitaxial thickness, which is related to the vertical direction growth rate of an epitaxial layer, is controlled by the flowing-in amount of a reactive gas or by the time of growth; however, there is no way to control the horizontal direction growth rate (a side surface growth direction of an epitaxial layer).

In the case of MOCVD, it is possible to control the epitaxial layer thickness growth by controlling the Group V/Group III ratio—that is, Group V material amount/Group III material amount-and the growth temperature of the reactive gas. However, a desired performance cannot be achieved. There are no methods at present for controlling the shape and size of the quantum wire when forming a quantum wire on a V-shaped groove since the ratio of horizontal growth rate to vertical growth rate does not exceed 2. Therefore, the growth conditions are disadvantageously subordinated to the inherent growth conditions.

SUMMARY OF THE INVENTION

Accordingly, it is an object of the present invention to provide an epitaxial growth rate varying method for a side surface of a semiconductor pattern, which overcomes the problems encountered in a conventional epitaxial growth rate varying method for a side surface of a patterned semiconductor.

It is another object of the present invention to provide an improved epitaxial growth rate varying method for a side surface of a patterned semiconductor capable of controlling a growth rate of a side surface of the patterned semiconductor by controlling the rate of flow of $CCl_4$ gas when forming an epitaxial layer on a patterned GaAs substrate in a metalorganic chemical deposition method, thus fabricating a desired quantum wire.

To achieve the above objects, there is provided an epitaxial growth rate varying method for a side surface of a patterned semiconductor which is characterized by controlling a side-surface growth rate of an epitaxial layer in accordance with the amount of $CCl_4$ gas flow provided while an epitaxial layer is formed on a patterned GaAs substrate in a metalorganic chemical deposition method while achieving a desired substantial flatness.

BRIEF DESCRIPTION OF THE DRAWINGS

FIGS. 1A through 1D are cross-sectional views of a semiconductor pattern formed on a mesa of a semiconductor device in which a facet thereof grows in accordance with the flow of $CCl_4$ gas according to the present invention wherein the views are obtained using a scanning electron microscope; of which.

FIGS. 3A through 3D are cross-sectional views of a multilayer growth configuration formed on a mesa when the $CCl_4$ is provided at a flow rate of 0.3 cc/min, wherein the views are obtained using a scanning electron microscope; of which.

FIGS. 5A through 5D are cross-sectional views of a multilayer growth configuration in accordance with $CCl_4$ gas flow rate with respect to a V-groove of a semiconductor device according to the present invention, wherein the views are obtained using a scanning electron microscope; of which.

FIGS. 6A through 6D are cross-sectional views of a multilayer growth configuration of a V-groove by providing $CCl_4$ gas at a flow rate of 0.3 cc/min in accordance with a growth temperature according to the present invention, wherein the views are obtained using a scanning electron microscope; of which.

DETAILED DESCRIPTION OF THE INVENTION

An epitaxial growth rate varying method for a side surface of a semiconductor pattern according to the present invention will now be explained with reference to the accompanying drawings.

To begin with, a mesa and a V-shaped groove are formed on a GaAs substrate using a photolithography method and a wet etching method, and an epitaxial layer is formed thereon in a MOCVD method. At this time, high purity hydrogen is used as a carrier gas, and the hydrogen is supplied at 5 liters per minute. In addition, as a Group III metallo organic material, trimethylgallium and trimethylaluminium are used, and for a Group V material, a 10% diluted arsenic containing gas is used, and for $CCl_4$, a gas diluted to 1000 ppm is used.

Here, the growth temperature is within a range of 650° C.–850° C. and the flow rate of $CCl_4$ gas is within a range of 0–0.3 cc/min.

The present invention is directed to providing two kinds of epitaxially grown materials, one of which is a GaAs/$Al_{0.5}Ga_{0.5}As$ multilayer. In this case, the GaAs and $Al_{0.5}Ga_{0.5}As$ epitaxial layers are formed by flowing $CCl_4$ gas because it is possible to check the facet evolution of a growing epitaxial layer more easily. In addition, the other epitaxially grown material is a material having five quantum wells. That is, the method is directed to depositing a GaAs buffer layer having a thickness of 100 nm on a GaAs substrate having a V-shaped groove. Thereafter, 5 cycles of 5 nm thick GaAs quantum well/50 nm thick $Al_{0.5}Ga_{0.5}As$ layers are formed, an $Al_{0.5}Ga_{0.5}As$ layer of 200 nm thickness is grown thereon, and finally a GaAs covering layer of 20 nm thickness is formed thereon so as to prevent surface oxidization.

Here, the GaAs quantum well layer is formed by flowing $CCl_4$ at a rate of 0.3/min, and the other layers are not doped. The thusly formed test material is observed using a scanning electron microscope, and the cross-sectional view of the quantum well is observed using a transmission electron microscope.

Figure 1A:
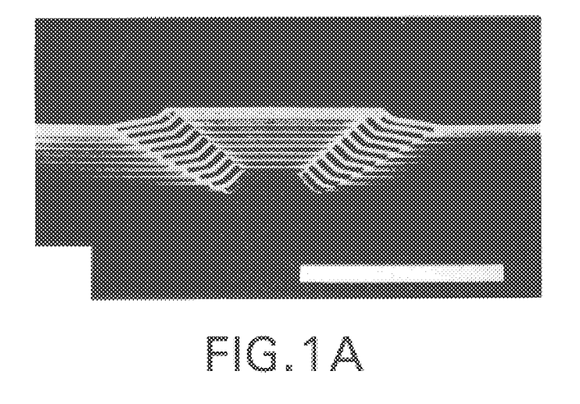
FIG. 1A is a cross-sectional view of a crystal layer growth of a multilayer structure in the case when $CCl_4$ gas is not provided.
Figure 1B:
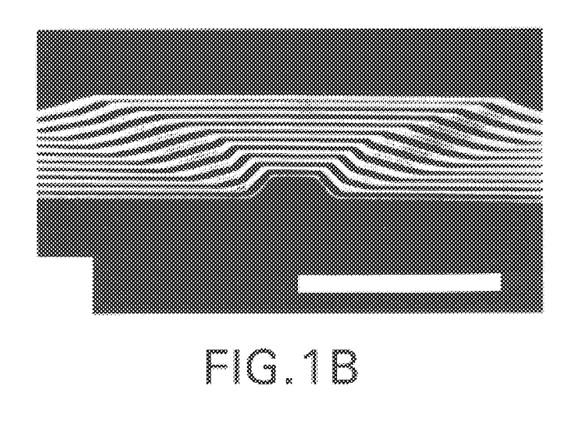
FIG. 1B is a cross-sectional view of a multilayer growth aspect in the case where $CCl_4$ gas is provided at 0.05 cc/min.
Figure 1C:
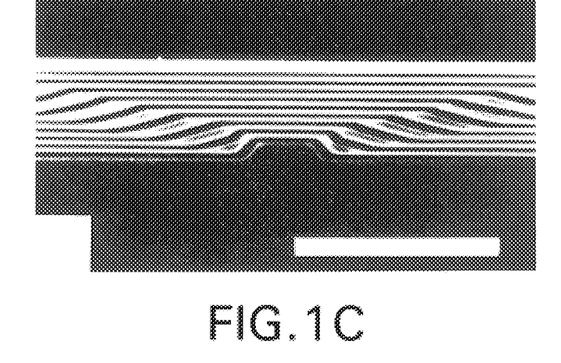
FIG. 1C is a cross-sectional view of a multilayer growth aspect in the case where $CCl_4$ gas is provided at 0.1 cc/min.
Figure 1D:
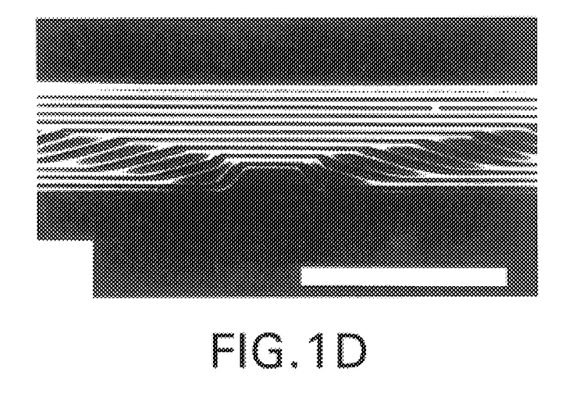
FIG. 1D is a cross-sectional view of a multilayer growth aspect in the case where $CCl_4$ gas is provided at 0.2 cc/min.

FIG. 1A shows the crystal layer growth of a multilayer structure when the $CCl_4$ is not doped; FIG. 1B shows a multilayer growth structure when the $CCl_4$ is provided at a rate of 0.05 cc/min; FIG. 1C shows a multilayer growth structure when the $CCl_4$ is provided at a flow rate of 0.1 cc/min; and FIG. 1D shows a cross-sectional view of a multilayer growth structure when the $CCl_4$ is provided at a flow rate of 0.2 cc/min. In the pictures, the darker parts denote GaAs, and the lighter parts denote $Al_{0.5}Ga_{0.5}As$.

As shown in FIGS. 1A through 1D, when $CCl_4$ is provided, the growth rate of the side surface of the GaAs epitaxial layer increases, and the facet evolution thereof changes. At this time, the side surface growth rate of the $Al_{0.5}Ga_{0.5}As$ epitaxial layer increases; however, it is less than that of the GaAs.

Figure 3A:
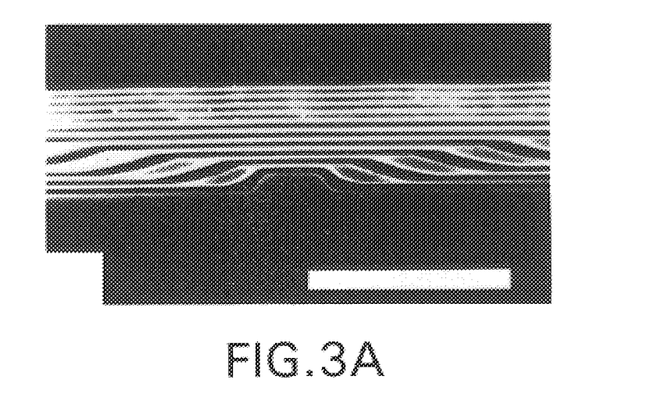
FIG. 3A is a cross-sectional view of a multilayer growth configuration when a growth temperature is 650° C.
Figure 3B:
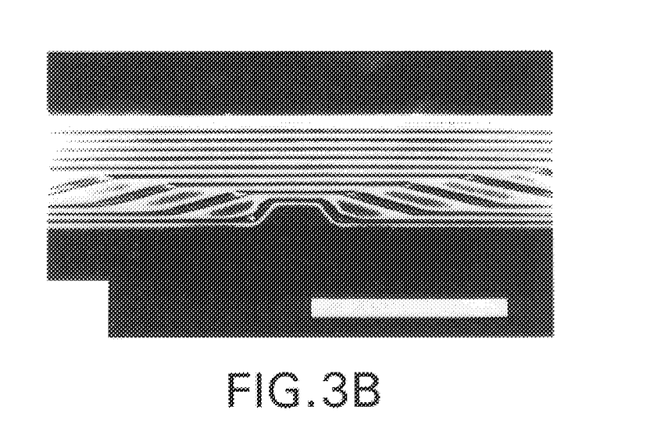
FIG. 3B is a cross-sectional view of a multilayer growth configuration when a growth temperature is 750°0 C.
Figure 3C:
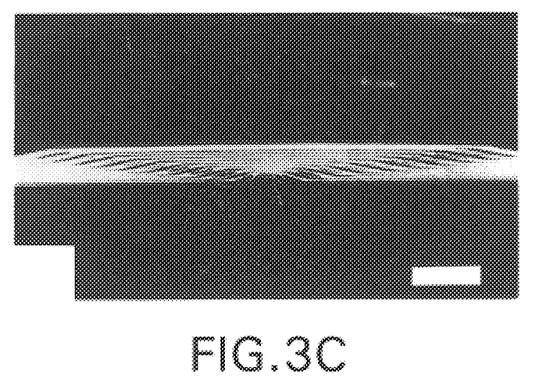
FIG. 3C is a low magnified SEM picture of the sample shown in FIG. 3B.
Figure 3D:
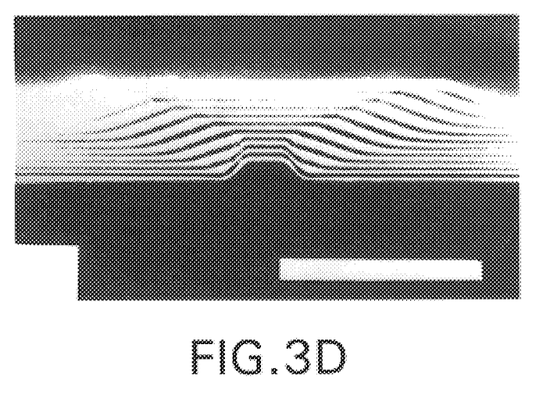
FIG. 3D is a cross-sectional view of a multilayer growth configuration when a growth temperature is 850°0 C.

As shown in FIG. 1A, in the case when the $CCl_4$ is not provided, the thickness at an upper portion of the mesa is about 8 $\mu$m; however, as shown in FIG. 3D, when the $CCl_4$ is provided at a flow rate of 0.3 cc/min, the thickness thereof is 57 $\mu$m.

Figure 2:
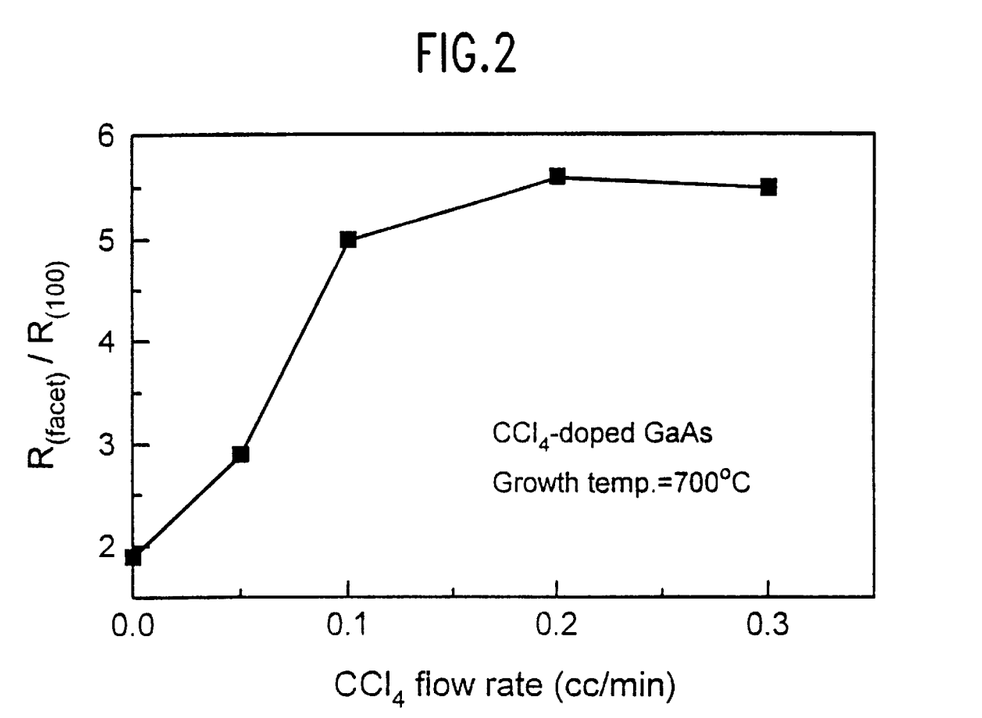
FIG. 2 is a graph showing the variation of the ratio between a growth rate of a GaAs epitaxial layer at a mesa crystal side surface and a growth rate at a unpatterned surface in accordance with the flow rate of $CCl_4$ gas according to the present invention.

FIG. 2 shows a graph showing the variation of the ratio between a growth rate of a GaAs epitaxial layer at a mesa side crystal surface and a growth rate at a unpatterned surface in accordance with the flow rate of $CCl_4$ gas according to the present invention. As shown therein, at the beginning thereof, the ratio $R_{facet}/R_{100}$ sharply increases; however, the increase stops when the $CCl_4$ is provided at a flow rate of 0.2 cc/min. At this time, the maximum ratio reaches about 5.5. Therefore, in accordance with the flow rate of the $CCl_4$, it is possible to control the growth rate of the side surface of the GaAs epitaxial layer. The feature above can be very usefully employed in fabricating an optical device.

FIGS. 3A through 3D show multilayer growth configurations formed on a mesa in the case when $CCl_4$ is provided at a flow rate of 0.3 cc/min, and the pictures are taken using a scanning electron microscope; of which, FIG. 3A shows a multilayer growth configuration when a growth temperature is 650° C.; FIG. 3B shows a cross-sectional view of a multilayer growth configuration when a growth temperature is 700° C.; FIG. 3C is a low magnification SEM picture of the sample shown in FIG. 3B showing the entire multilayer structure; and FIG. 3D shows a multilayer growth configuration when a growth temperature is 850° C. As shown therein, it is noted that as the growth temperature increases, the side surface growth rate of the GaAs epitaxial layer decreases.

As shown in FIG. 1A, in case the $CCl_4$ is not provided, the thickness at an upper portion of the mesa is about 8 $\mu$m; however, as shown in FIG. 3D, when the $CCl_4$ is provided at a flow rate of 0.3 cc/min, the thickness thereof is 57 $\mu$m.

Figure 4:
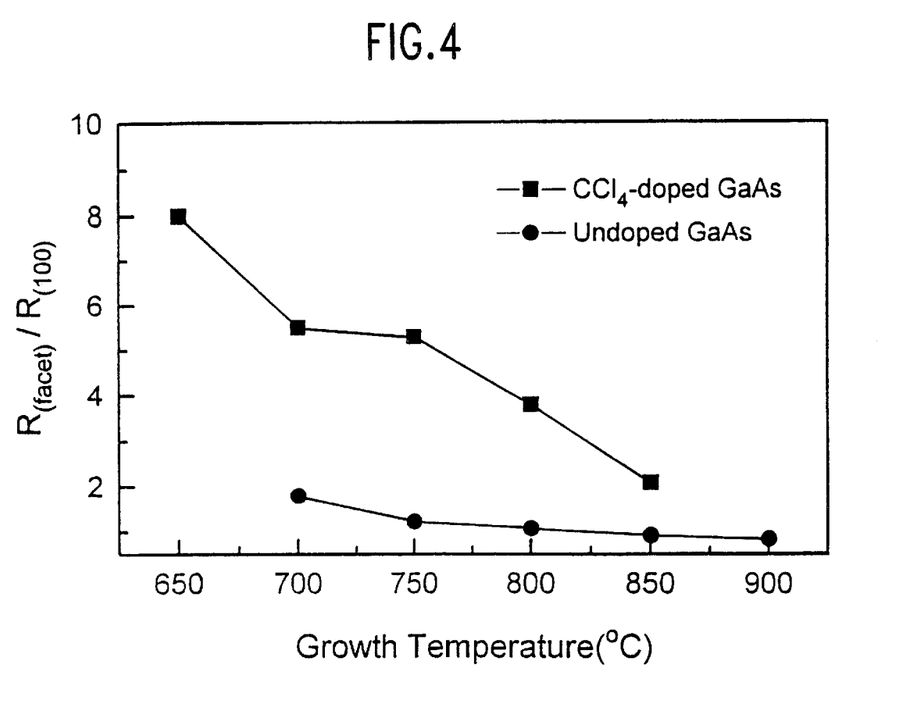
FIG. 4 is a graph showing the variation of the ratio between a growth rate of a mesa side surface of a GaAs epitaxial layer and a growth rate at a surface in which a patterning is not performed, as a function of a growth temperature according to the present invention.

FIG. 4 shows a graph of the variation of the ratio between a growth rate of a mesa side surface of a GaAs epitaxial layer and a growth rate at a surface in which a patterning is not performed, as a function of a growth temperature according to the present invention. In the case of doping with $CCl_4$, the ratio $R_{facet}/R_{100}$ reaches eight at the growth temperature of 650° C. That is, there is a substantial difference between when the $CCl_4$ is provided and when the $CCl_4$ is not provided. Also, it is noted that when providing the $CCl_4$, it is possible to control the side surface growth ratio by varying the growth temperature.

Figure 5A:
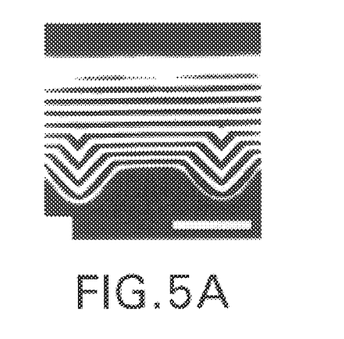
FIG. 5A is a cross-sectional view of a multilayer growth configuration when $CCl_4$ gas is not provided.
Figure 5B:
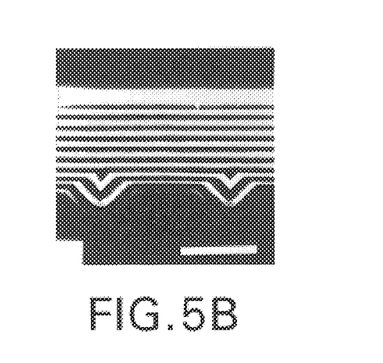
FIG. 5B is a cross-sectional view of a multilayer growth configuration when $CCl_4$ gas is provided at a flow rate of 0.1 cc/min.
Figure 5C:
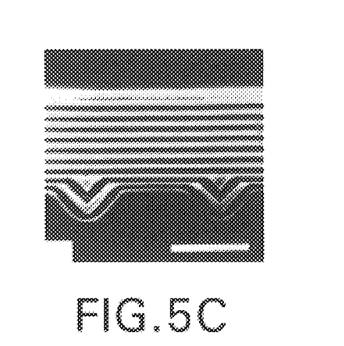
FIG. 5C is a cross-sectional view of a multilayer growth configuration when $CCl_4$ gas is provided at a flow rate of 0.2 cc/min.
Figure 5D:
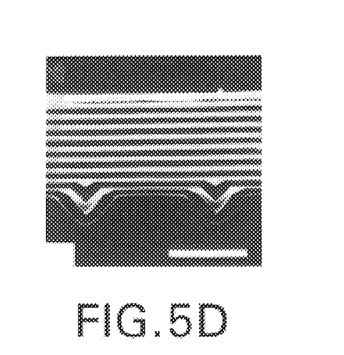
FIG. 5D is a cross-sectional view of a multilayer growth configuration when $CCl_4$ gas is provided at a flow rate of 0.3 cc/min.

FIGS. 5A through 5D show views, obtained with a scanning electron microscope, of a multilayer growth configuration as a function of the $CCl_4$ gas flow rate, of a multilayer construction formed on a V-groove of a semiconductor device according to the present invention; of which, FIG. 5A shows a cross-sectional view of a multilayer growth configuration when $CCl_4$ is provided at a flow rate of 0.05 cc/min; FIG. 5B shows a multilayer growth configuration when $CCl_4$ is provided at a flow rate of 0.1 cc/min; FIG. 5C shows a multilayer growth configuration when $CCl_4$ is provided at a flow rate of 0.2 cc/min; and FIG. 5D shows a multilayer growth configuration when $CCl_4$ is provided at a flow rate of 0.3 cc/min. As shown in FIG. 5A, when the $CCl_4$ flow rate was low, flatness was achieved after a fifth GaAs layer growth was completed; however, as shown in FIG. 5B, flatness was achieved after a third GaAs layer growth was completed, and as shown in FIG. 5C, flatness was achieved when a second GaAs layer growth was completed. Therefore, the flatness of the device can be controlled according to the flow rate of $CCl_4$.

When comparing the GaAs thickness without a pattern and the thickness of the GaAs layer at the V-shaped groove, it is noted that an isolated quantum wire structure can be formed.

Figure 6A:
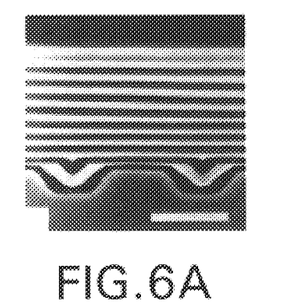
FIG. 6A is a cross-sectional view of a multilayer growth configuration when the growth temperature is 700°0 C.
Figure 6B:
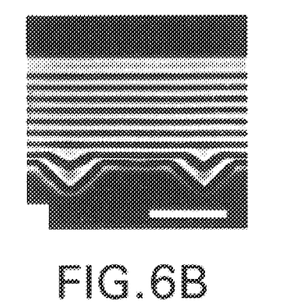
FIG. 6B is a cross-sectional view of a multilayer growth configuration when the growth temperature is 750° C.
Figure 6C:
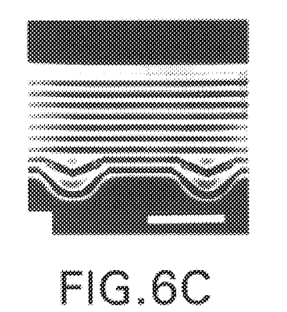
FIG. 6C is a cross-sectional view of a multilayer growth configuration when the growth temperature is 800°0 C.
Figure 6D:
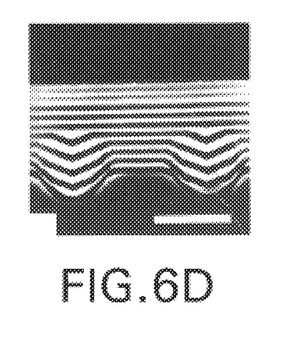
FIG. 6D is a cross-sectional view of a multilayer growth configuration when the growth temperature is 850°0 C.

FIGS. 6A through 6D show multilayer growth configurations formed on a V-groove by providing $CCl_4$ gas at a flow rate of 0.3 cc/min in accordance with a growth temperature according to the present invention, and the views are obtained using a scanning electron microscope; of which, FIG. 6A shows a multilayer growth configuration when the growth temperature is 650° C.; FIG. 6B shows a multilayer growth configuration when the growth temperature is 750° C.; FIG. 6C shows a multilayer growth configuration when the growth temperature is 800° C.; and FIG. 6D shows a multilayer growth configuration when the growth temperature is 850° C. As shown therein, it is noted that as the growth temperature increases, the side surface growth rate of the GaAs epitaxial rate decreases.

The above-mentioned advantageous features can be utilized in various applications. For example, by adopting the features in fabricating the device, the following result can be obtained.

Figure 7:
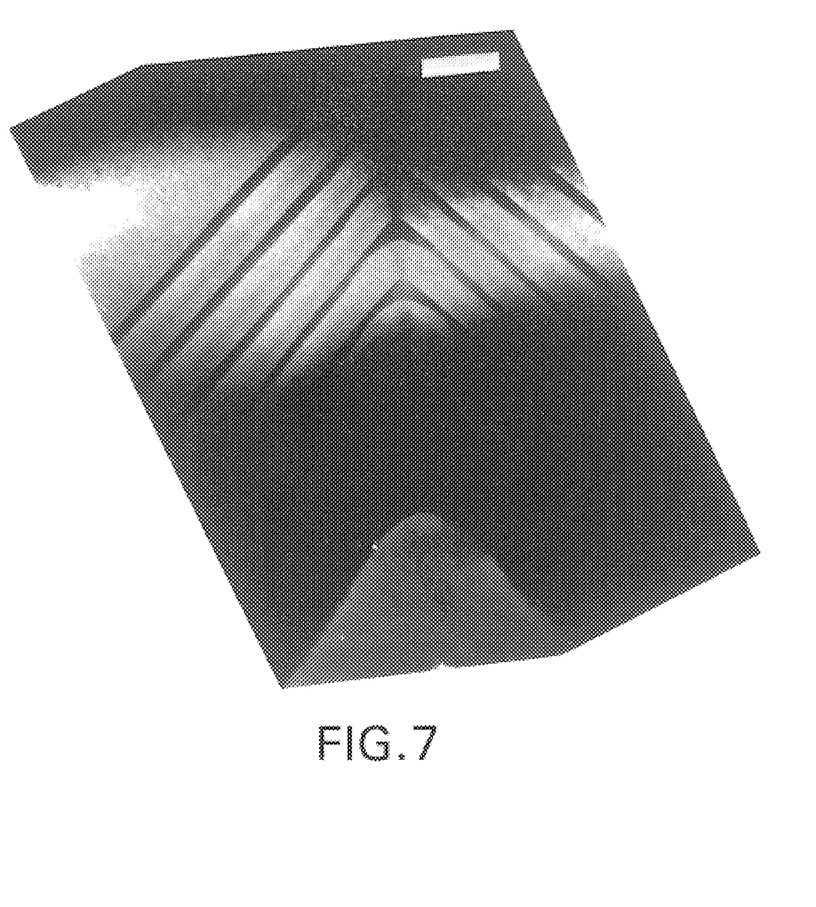
FIG. 7 is a cross-sectional view of a quantum wire formed on a V-groove by providing $CCl_4$ gas according to the present invention, wherein the view is obtained using a scanning electron microscope.

That is, FIG. 7 shows a quantum wire formed on a V-groove by providing $CCl_4$ gas according to the present invention. The view is obtained using a scanning electron microscope. As shown therein, in the planar surface which is not patterned, though the quantum wire has a thickness of 5 nm, a new moon-shaped quantum wire can have a width of 16 nm and a thickness of 28 nm. As a consequence, the ratio of quantum wire thickness/quantum well thickness reaches 5.5, compared to the case of a common quantum wire where the ratio cannot be greater than 2. Therefore, it is noted that the ratio according to the method of the invention is very high.

As described above, the epitaxial growth rate varying method for a side surface of a semiconductor pattern according to the present invention includes the following advantages: 1) when forming an epitaxial layer on a patterned GaAs substrate in a metallorganic chemical deposition method, it is possible to control the side-surface growth rate of an epitaxial pattern by doping with $CCl_4$, and in addition, it is possible to achieve a desired flatness of the product; 2) using the above-mentioned features, a desired quantum wire can be fabricated, so that it is possible to obtain a desired optical characteristic of the quantum wire irrespective of the quantum well because of a relatively substantial difference between the thicknesses of the quantum well and the quantum wire and a distinctive difference of the optical excitation photoluminescence; 3) generally, the optical excitation luminance intensity ratio $I_{QWR}/I_{QWL}$ is in proportion to the volume ratio $V_{QWR}/V_{QWL}$ between the quantum wire and the quantum well in an excited region, and in the present invention, since the volume ratio increase is at least greater than five, the optical excitation luminance intensity ratio can be substantially increased, where $I_{QWR}$ and $I_{QWL}$ are the luminance intensities of a quantum wire and a quantum well, respectively, and $V_{QWR}$ and $V_{QWL}$ are the volumes of a quantum wire and a quantum well, respectively. In addition, since it is possible to fabricate a substantially thick quantum wire even though the thickness of the quantum well is thin, it is possible to fabricate a desired quantum wire by removing the quantum well in an impurity induced layer disordering method, so that a high reliability product can be obtained.

What is claimed is:

1. A method for varying the growth rate of a side surface of an epitaxial layer formed by a metalorganic chemical vapor deposition (MOCVD) method on a GaAs semiconductor substrate having a patterned surface including side surfaces, characterized by the step of controlling the rate of growth of said epitaxial layer on the side surfaces of the patterned substrate by controlling the amount of $CCl_4$ gas supplied during the epitaxial deposition, thereby forming a substantially flat epitaxial layer over the substrate.

2. The method of claim 1, wherein the concentration of said $CCl_4$ is 1000 ppm diluted in hydrogen gas.

3. The method of claim 1, wherein said patterned GaAs substrate is prepared by means of a photolithography method and a wet etching method.

4. The method of claim 1, wherein said metalorganic chemical deposition method comprises using an arsenic containing gas diluted to 10% in trimethylgallium, trimethylaluminium, and hydrogen.

5. The method of claim 1, wherein said patterned GaAs substrate comprises a mesa or a V-shaped groove.

6. The method of claim 1, wherein said epitaxial layer is formed on a GaAs substrate patterned to have a mesa and comprises a multilayer structure of $GaAs/Al_{0.5}Ga_{0.5}As$.

7. The method of claim 5, wherein said epitaxial layer is formed on a GaAs substrate patterned to have a mesa and comprises a multilayer structure of $GaAs/Al_{0.5}Ga_{0.5}As$.

8. The method of claim 1, wherein said epitaxial layer is formed on a GaAs substrate patterned to have a V-shaped groove therein and comprises a five cycle $GaAs/Al_{0.5}Ga_{0.5}As$ quantum well formed on a side surface of said V-shaped groove.

9. The method of claim 5, wherein said epitaxial layer is formed on a GaAs substrate patterned to have a V-shaped groove therein and comprises a five cycle $GaAs/Al_{0.5}Ga_{0.5}As$ quantum well formed on a side surface of said V-shaped groove.

10. The method of claim 1, wherein said $CCl_4$ gas is provided at a flow rate of 0.3 cc/min.

11. The method of claim 6, wherein said $GaAs/Al_{0.5}Ga_{0.5}As$ multilayer structure is doped with $CCl_4$.

12. The method of claim 7, wherein said $GaAs/Al_{0.5}Ga_{0.5}As$ multilayer structure is doped with $CCl_4$.

13. The method of claim 1, wherein said epitaxial layer is formed on a GaAs substrate having a V-shaped groove for forming a GaAs quantum well.

14. The method of claim 4, wherein said epitaxial layer is formed on a GaAs substrate having a V-shaped groove for forming a GaAs quantum well.

15. The method of claim 1, wherein a quantum wire is formed using a quantum well which is formed by using a patterned GaAs substrate having a V-shaped groove.

16. The method of claim 4, wherein a quantum wire is formed using a quantum well which is formed by using a patterned GaAs substrate having a V-shaped groove.

* * * * *